United States Patent
Arai et al.

(10) Patent No.: US 6,406,802 B1
(45) Date of Patent: Jun. 18, 2002

(54) ORGANIC ELECTROLUMINESCENT COLOR DISPLAY

(75) Inventors: Michio Arai; Hiroshi Yamamoto, both of Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 09/321,124

(22) Filed: May 27, 1999

(51) Int. Cl.$^7$ ................................ H05B 33/22
(52) U.S. Cl. ............... 428/690; 313/506; 252/301.35
(58) Field of Search .................. 428/690, 917; 313/502, 503, 504, 506; 252/301.35

(56) References Cited

U.S. PATENT DOCUMENTS

| | | | | |
|---|---|---|---|---|
| 4,835,061 A | * | 5/1989 | Ohta et al. ................ | 428/469 |
| 5,952,779 A | | 9/1999 | Arai et al. ................ | 313/504 |
| 5,958,610 A | * | 9/1999 | Yonekawa et al. ......... | 428/690 |
| 5,969,474 A | | 10/1999 | Arai ........................ | 313/504 |
| 6,007,927 A | * | 12/1999 | Nishikawa et al. ........ | 428/690 |
| 6,137,459 A | * | 10/2000 | Eida et al. ................ | 345/76 |

FOREIGN PATENT DOCUMENTS

| | | |
|---|---|---|
| JP | 7-142168 | 6/1995 |
| JP | 8-279394 | 10/1996 |
| JP | 10-144469 | 5/1998 |
| JP | 11-121164 | 4/1999 |
| JP | 11-126689 | 5/1999 |
| JP | 11-195487 | 7/1999 |

* cited by examiner

*Primary Examiner*—Cynthia H. Kelly
*Assistant Examiner*—Dawn L. Garrett
(74) *Attorney, Agent, or Firm*—Oblon, Spivak, McClelland, Maier & Neustadt, P.C.

(57) ABSTRACT

An object of the invention is to provide an organic EL color display which can be fabricated easily and at low costs yet with high reliability. This object is achievable by the provision of an organic EL color display comprising a substrate and, in order from the substrate, a fluorescence converting layer containing a fluorescent material and/or a color filter, an organic layer, a barrier layer and an organic EL structure. The organic layer is formed of a thermosetting resin or an ultraviolet curing resin, and the barrier layer contains silicon oxide.

40 Claims, 1 Drawing Sheet

ORGANIC ELECTROLUMINESCENT COLOR DISPLAY

BACKGROUND OF THE INVENTION

ART FIELD

The present invention relates to a display, and especially a color display, which comprises an organic electroluminescent light emitting device (which will hereinafter be often called an organic EL device for short) using an organic compound.

BACKGROUND ART

In recent years, organic EL light emitting devices have been under intensive investigation. Basically, this device is made up of a hole injecting electrode such as a tin-doped indium oxide (ITO) electrode, a hole transporting material film such as a triphenyldiamine film formed thereon, a light emitting layer formed of a fluorescent material such as an aluminum quinolinol complex (Alq3) and laminated on the hole transporting film, and a metal electrode (electron injecting electrode) formed of a metal having a low work function such as Mg and provided on the light emitting layer. Such an organic EL device attracts attentions because they can achieve a very high luminance ranging from a few hundred to tends of thousands of $cd/m^2$ with a driving voltage of approximately 10 volts.

Displays constructed using such an organic EL device may potentially have various applications, and its application to color displays in particular is an important challenge. When a light emitting device is applied as a color display, for instance, it is a common procedure to vary the color of light emitted from the light emitting device or use color filters to obtain the three primary colors, blue, green and red.

One known approach to varying the color of light emitted from a light emitting device itself is embodied by a color light emitting device as typically set forth in SID 96 DIGEST.185 14.2: Novel Transparent Organic Electroluminescent Devices G. Gu, V. B. Bulovic, P. E. Burrows, S. R. Forrest, M. E. Tompson. However, this color light emitting device (heterostructure organic light emitting device) has a multilayer structure comprising light emitting layers (Red ETL, Green ETL and Blue ETL) corresponding to the three primary colors, R, G, and B, respectively. One problem with this device is that its structure becomes complicated with a production cost increase because a cathode and an anode must be provided for each light emitting layer. Another problem is that the color balance is disturbed with use due to a service life difference between the three primary colors.

On the other hand, a color display constructed using a single light emitting device in combination with a fluorescence converting layer formed of a fluorescent material and/or a color filter layer may be a good system, because a simple and inexpensive arrangement is not only achievable by use of a single organic EL device alone but also full-color displays are obtainable by forming the fluorescence converting layer and/or color filter layer according to a given pattern. In view of patterning technologies, damages to the organic EL structure, etc., however, it is very difficult to provide the fluorescence converting layer and/or color filter layer on the organic EL structure according to a predetermined pattern. When an organic EL device is constructed by patterning the fluorescence converting layer and/or color filter layer on the organic EL structure provided on a substrate, the organic EL device cannot perform its own function, because there is a step between the organic EL structure and the fluorescence converting layer and/or color filter layer. This step causes breaks in the film (discontinuities in the film), which make wiring impossible, resulting in a current failure.

SUMMARY OF THE INVENTION

An object of the present invention is to provide an organic EL color display which can be fabricated easily and at low costs yet with high reliability.

Such an object is accomplished by the inventions defined below.

(1) An organic EL color display comprising a substrate and, in order from said substrate, a fluorescence converting layer containing a fluorescent material and/or a color filter, layer an organic layer, a barrier layer and an organic EL structure, wherein:

said organic layer is formed of a thermosetting resin or an ultraviolet curing resin, and said barrier layer contains silicon oxide.

(2) The organic EL color display of (1), wherein said barrier layer has an average surface roughness (Ra) of 2 to 50 nm.

(3) The organic EL color display of (1), wherein said barrier layer has been subjected to a plasma treatment.

(4) The organic EL color display of (1), wherein said organic layer is formed of an acrylic resin.

(5) The organic EL color display of (1), wherein said barrier layer has a refractive index of 1.40 to 1.55 at a wavelength of 632 nm.

(6) The organic EL color display of (1), wherein said silicon oxide is represented by $SiO_x$ where x=1.8 to 2.2.

(7) The organic EL color display of (1), wherein said silicon oxide is represented by $SiO_x$ where x=1.5 to 1.9, and contains at least one of carbon and nitrogen in an amount of up to 20 at % as calculated on C and N bases.

(8) The organic EL color display of (1), wherein said barrier layer has an emitted light transmittance of at least 80%.

(9) The organic EL color display of (1), wherein said barrier layer has been formed by a sputtering process.

EXPLANATION OF THE PREFERRED EMBODIMENTS

Figure 1:
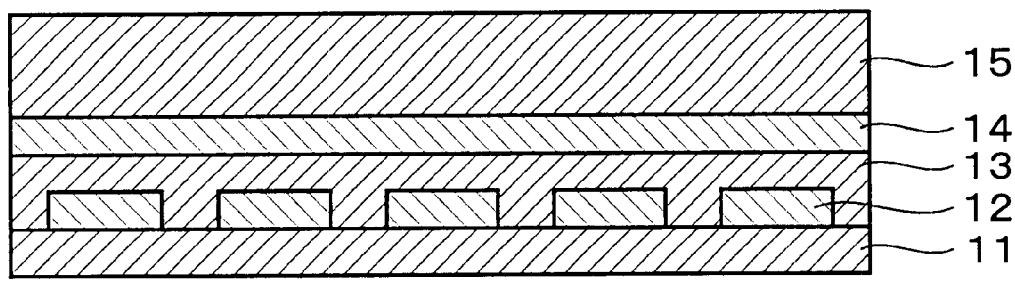
FIG. 1 is a schematic view of one embodiment of the organic EL color display according to the invention.

Some preferred embodiments of the invention will now be explained more specifically.

The organic EL color display of the invention comprises a substrate and, in order from the substrate, a fluorescence converting layer including a fluorescent material and/or a color filter layer, an organic layer, a barrier layer and an organic EL structure. The organic layer is formed of a thermosetting resin or an ultraviolet curing resin, and the barrier layer contains silicon oxide $SiO_x$.

The substrate and the fluorescence converting layer and/or color filter layer provided thereon are made flat by covering them with the organic layer. This prevents breaks in these layers even when an organic EL structure is laminated on the organic layer, and so ensures that an organic EL color display can be fabricated with high reliability. When the organic EL structure is laminated directly on the organic layer, however, the components of the organic layer volatilize off due to heat generated especially during the lamination of the organic EL structure on the organic layer, and driving. These volatilized components in turn have an adverse influence on the constituents of the organic EL structure, resulting in the occurrence of non-emitting regions called dark spots or a failure in maintaining light emission of given quality. To avoid this, the $SiO_x$-containing barrier layer is interleaved between the organic layer and the organic EL structure, thereby preventing diffusion of the organic layer components into the organic EL structure and, hence, preventing any deterioration of the device. In addition, the barrier layer protects the organic EL structure, which is very sensitive to moisture, against the outside air, moisture, etc., for improvements in the storability and robustness of the device.

The organic layer is formed of a thermosetting resin or an ultraviolet curing resin. The thermosetting resin is preferable because it ensures that the surface of the organic layer becomes smoother due to heat generated during setting. Among theses resins, an acrylic resin is most preferred. The resins may be used alone or in combination of two or more. Usually, the organic layer is formed by coating the resin or resins on the substrate and the fluorescence converting layer and/or color filter layer and thermosetting or UV curing them. An ordinary thermosetting resin is set at a temperature of the order of 140 to 180° C. The ultraviolet curing resin is usually cured by irradiation with ultraviolet light in a total quantity of light of 1,000 to 10,000 mJ.

Preferably, the organic layer should have an emitted light transmittance of at least 90%. As the transmittance decreases, the light emitted from an light emitting layer itself tends to attenuate, ending up with a failure in obtaining the luminance needed for the light emitting device.

Insofar as the advantages of the invention are achievable, it is noted that no particular limitation is imposed on the distance between the upper surface of the organic layer and the substrate.

Preferably, the barrier layer should have a refractive index of 1.40 to 1.55, and especially 1.44 to 1.48 at 632 nm. At a higher refractive index, the barrier layer loses barrier capabilities with respect to the components in the organic layer. At a lower refractive index, the barrier layer loses barrier capabilities with respect to moisture, etc.

In addition to $SiO_x$, the barrier layer may contain up to 0.5 wt % of N, C, Ar, etc. in the form of inevitable impurities.

In $SiO_x$, it is preferable that x is in the range of 1.8 to 2.2, and especially 1.90 to 2.05. If x has such a value as an average value throughout the barrier, it is then acceptable that the value of x may have a gradient in a thickness direction.

More preferably, the barrier layer should contain $SiO_x$ where x is in the range of 1.5 to 1.9 and carbon and/or nitrogen in an amount of up to 20 at %, and especially 3 to 15 at % as calculated on C and N bases. By allowing the barrier layer to contain C and N in the above range, the film density of the barrier layer is increased. However, if the contents of C and N exceed the upper limit of the above range, film stresses increase. In this regard, the value of x may have a gradient in the thickness direction. It is noted that the contents of carbon and nitrogen, if they are contained in the barrier layer, should be in the above-mentioned range.

Preferably, the barrier layer should have an average surface roughness (Ra) of 2 to 50 nm, and a maximum surface roughness (Rmax) of 10 to 50 nm. As the surface film flatness of the barrier layer becomes worse, current leaks or dark spots are likely to occur. For this reason, it is preferable to select appropriate film deposition conditions so as to reduce growth of abnormal particles and thereby keep the average surface roughness (Ra) and maximum surface roughness (Rmax) of the interface of the barrier layer contiguous to the hole injecting electrode in the above-mentioned range.

The logic density, i.e., film density of the barrier layer-forming material should be preferably 85% or more and more preferably 90% or more. The upper limit to this density may be of the order of 98% although it is ideally 100%. By allowing the film density to come within the above-mentioned range, it is possible to prevent degassing of the organic layer and a decrease of the degree of shrinkage thereof.

Preferably, the barrier layer should have an emitted light transmittance of at least 80%. At a lower transmittance, the light emission from the light emitting layer itself tends to attenuate, ending up with a failure in obtaining the luminance needed for the light emitting device.

The barrier layer should have a thickness of preferably 5 to 100 nm, more preferably 5 to 50 nm, and even more preferably 10 to 30 nm although the invention is not necessarily limited thereto.

When the barrier layer is formed, it is preferable that the surface of the organic layer has been subjected to a plasma treatment so as to make it rough. By forming the barrier layer on the organic layer having a suitable surface roughness, it is possible to improve the adhesion of the barrier layer to the organic layer by an anchor action and thereby better the effect of the barrier layer.

Preferably, the plasma treatment should be carried out with a power input of RF 500 W for 30 seconds to 5 minutes while $Ar:O_2$ ($O_2$: 100 to 10%) is introduced in the atmosphere.

The plasma treatment may be carried out using a plasma ashing system, a sputtering system or the like.

Although this $SiO_x$-containing film may be formed as by a plasma CVD process, yet it should preferably be formed by a sputtering process. An RF sputtering process using an RF power source is particularly preferred for the formation of such a film as mentioned above. With the plasma CVD process, there is a great possibility that hydrogen may be entrained by reaction gases into the film, thereby causing degradation of the barrier capabilities with respect to moisture.

When the barrier layer is formed using the sputtering process, inert gases used with an ordinary sputtering system may be used as sputtering gases. Preferably, Ar, Kr, and Xe should be used alone or in combination of two or more.

Ar, Kr, and Xe are preferable because they are inert gases, and have a relatively large atomic weight. If the Ar, Kr, and Xe gases are used, the sputtered atoms come in repeated collision with the gases before reaching the substrate, and then arrive at the substrate with a reduced kinetic energy. This in turn enables growth of particles to be so reduced that the film surface can become smoother.

When any one of Ar, Kr, and Xe is used as a main sputtering gas of the sputtering gases, it is preferable that the product of a substrate-target distance is in the range of 20 to 60 Pa·cm, and especially 30 to 50 Pa·cm. Insofar as this condition is applied, preferable results are obtainable regardless of what gas is used, but particular preference is given to using Ar.

For sputtering, it is preferable to use the RF sputtering process. It is then preferable that an RF sputtering system is operated with a power of 10 to 100 W/cm$^2$ at a frequency of 13.56 MHz. It is also preferable that the film deposition rate is in the range of 5 to 50 nm/min., while the film deposition pressure is in the range of 0.1 to 1 Pa.

On embodiment of the organic EL color display according to the invention is shown in FIG. 1. As shown in FIG. 1, the organic EL color display comprises a substrate 11 and, in order from the substrate 11, a fluorescence converting substance-containing fluorescence converting layer and/or a color filter layer 12, an organic layer 13, a barrier layer 14 and an organic EL structure 15. If required, the fluorescence converting layer and/or color filter layer may have a double- or multi-layer structure.

The organic EL color display of the invention is designed to take emitted light out of the substrate side through the fluorescence converting layer and/or color filter layer, and so transparent or translucent materials such as glass, quartz, and resin are used for the substrate material.

The organic EL structure usually emits bluish green light with a wavelength band maximum wavelength of 400 to 550 nm. In the invention, there may be two or more light emission peaks.

In the organic EL color display of the invention, the green and blue emitting portions are obtained by a combination of the organic EL structure emitting bluish green light with a green transmitting layer and a blue transmitting layer. A red emitting portion is obtained by a combination of the organic EL structure emitting bluish green light with a fluorescence converting layer for converting the bluish green light from the organic EL structure to a wavelength close to red and a red transmitting layer. In other words, a color display can be composed only of a light emitting layer for giving off monochromatic light by allowing the fluorescence converting filter to make up for light of wavelength in the red direction, of which the bluish green light is devoid.

For the blue, green, and red transmitting layers of the invention, it is preferable to use color filters. For the color filter layers, use may be made of those used on liquid crystal displays, etc. However, it is preferable to control the characteristics of color filters in conformity to light emitted by the organic EL device, so that the efficiency of color extraction, and color purity can be optimized. The light cut off in this case is light having wavelengths of at least 560 nm and light having wavelengths of up to 480 nm for green, light having wavelengths of at least 490 nm for blue, and light having wavelengths of up to 580 nm for red. By use of such color filters, it is preferable to regulate the respective layers in conformity to chromaticity coordinates according to the NTSC standard or the current CRT standard. Such chromaticity coordinates may be determined by use of general chromaticity coordinates measuring equipment, for instance, BM-7 or SR-1 made by Topcon Co., Ltd. Each color filter layer may have a thickness of about 0.5 to 20 $\mu$m.

Alternatively, it is acceptable to use optical thin films such as dielectric multilayer films in place of the color filters.

The fluorescence converting layer according to the invention is provided to absorb light emitted from the EL device and allow a phosphor in the fluorescence converting film to give off light for the color conversion of color emission. To this end the layer is formed of three materials, i.e., a binder, a fluorescent material, and a light absorbing material.

The fluorescent material used herein should basically have high fluorescence quantum efficiency, and preferably exhibit strong absorption in the EL light emission wavelength range. Specifically, it is preferable to use a fluorescent material in which the light emission maximum wavelength $\lambda$max of a fluorescent spectrum is in the range of 580 to 630 nm. The fluorescent material suitable for the practice of the invention is dyes for lasers, for instance, rhodamine base compounds, perylene base compounds, cyanine base compounds, phthalocyanine base compounds (including subphthalocyanine, etc.), naphthaloimide base compounds, condensed cyclic hydrocarbon base compounds, condensed heterocyclic compounds, and styryl base compounds.

Basically, the binder may be selected from materials that do not extinguish fluorescence. Preference is given to materials that can be finely patterned by means of lithography, printing or the like, and that are not damaged upon the formation of ITO or IZO film acting as an anode.

The light absorbing material is used when the absorption of light by the fluorescent material is insufficient, and may be dispensed with if unnecessary. The light absorbing material is preferably selected from materials that do not extinguish the fluorescence the fluorescent material gives off.

By use of such a fluorescence converting filter layer, it is possible to obtain preferable values for x and y on the CIE chromaticity coordinates. The fluorescence converting filter layer should preferably have a thickness of about 0.5 to 20 $\mu$m.

Figure 2:
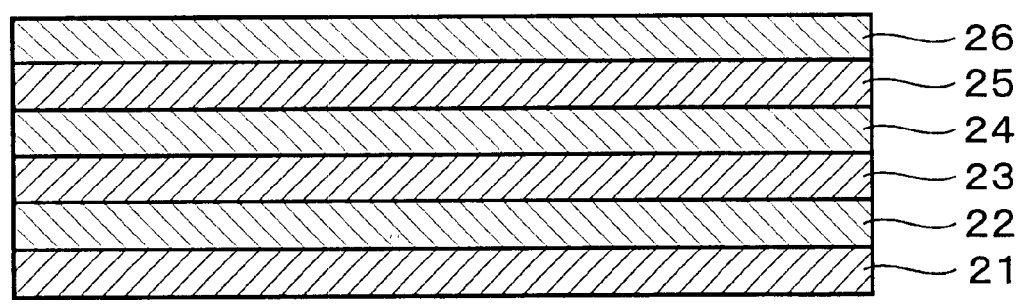
FIG. 2 is a schematic view of one embodiment of the organic EL structure according to the invention.

Next, an account is given of the organic EL structure forming part of the organic EL color display according to the invention. The organic EL structure is laminated or stacked on the barrier layer as depicted in FIG. 1. One embodiment of the organic EL display according to the invention is shown in FIG. 2. The organic EL structure embodiment depicted in FIG. 2 comprises an anode 21 that is a transparent electrode, a hole injecting layer 22, a hole transporting layer 23, a light emitting layer 24, an electron injecting and transporting layer 25 and a cathode 26 in the described order.

The EL structure of the invention is never limited to the illustrated embodiment, and so may have various structures. For instance, the electron injecting and transporting layer may be dispensed with or made integral with the light emitting layer, or alternatively the hole injecting, and transporting layers may be mixed with the light emitting layer.

The cathode and anode may be formed by an evaporation process, a sputtering process, etc. Such organic layers as represented by the light emitting layer may be formed by vacuum evaporation or the like. If necessary, these layers may be patterned, for example, by mask evaporation or film formation followed by etching whereby a desired light emitting pattern is accomplished.

To achieve effective electron injection, the cathode is preferably made up of a material having a low work function, 30 for instance, any one of metal elements such as K, Li, Na, Mg, La, Ce, Ca, Sr, Ba, Al, Ag, In, Sn, Zn, and Zr. To improve the stability of the cathode, it is preferably made up of a binary or ternary alloy system comprising two or three of the aforesaid metal elements. Preferable for such an alloy system, for instance, are Ag.Mg (Ag: 1 to 20 at %), Al.Li (Li: 0.3 to 14 at %), In.big (Mg: 50 to 80 at %), and Al.Ca (Ca: 5 to 20 at %).

The cathode thin film may have at least a thickness large enough to achieve satisfactory electron injection, for instance, of at least 0.1 nm, and preferably at least 1 nm. While there is no upper limit to film thickness, a film thickness of about 100 to 500 nm is usually preferred.

After the formation of the electrode, a protective film may be provided thereon, using at least one of an oxide, nitride or carbide of the cathode-constituting material component and/or a metal material such as Al, an inorganic material such as $SiO_x$ or an organic material such as Teflon. The protective film may be either transparent or opaque. To prevent entrance of moisture, oxygen or an organic solvent, the protective film should have a thickness of the order of 50 to 1,200 nm. Although no particular limitation is placed on how to form the protective film, that is, the protective film may be formed as by evaporation, it is preferable to make use of a sputtering process which enables the protective film to be formed subsequently to the formation of the cathode. By the provision of such a protective film, it is possible to prevent further oxidation of the cathode, thereby driving the organic EL device stably over an extended period of time.

It is further preferable to provide a sealing layer on the device so as to prevent oxidation of the organic layer or electrodes in the device. To prevent entrance of moisture, the sealing layer is provided by sealing the device with a glass or other sealing sheet, using an adhesive resin layer such as a commercially available low-hygroscopicity adhesive sheet layer based on light curing adhesives, epoxy adhesives, silicone adhesives, and crosslinked ethylene-vinyl acetate copolymer adhesives. Instead of the glass sheet, it is acceptable to use a metal sheet, a plastic sheet or the like.

The organic layer provided in the EL device of the invention will now be explained.

The light emitting layer has functions of injecting holes and electrons, transporting them, and recombining holes and electrons to create excitons. For the light emitting layer, it is preferable to use a compound that is stable to both electron and hole carriers, and is of strong fluorescence intensity.

The hole injecting layer has a function of facilitating injection of holes from the anode, and the hole transporting layer has functions of transporting holes, and blocking electron transportation, the former referred to as a charge injecting layer while the latter referred to as a charge transporting layer.

For example, when the compound used in the light emitting layer has a relatively low electron injecting and transporting function, there is provided an electron injecting and transporting layer having functions of facilitating injection of electrons from the cathode, transporting electrons, and blocking hole transportation.

The hole injecting layer, hole transporting layer, and electron injecting and transporting layer are effective for increasing the number of holes and electrons injected into the light emitting layer and confining holes and electrons therein for optimizing the recombination region to improve light emission efficiency.

The electron injecting and transporting layer may be constructed in the form of a double-layered structure consisting separately of a layer having an injecting function and a layer having a transporting function.

The thickness of the light emitting layer, the total thickness of the hole injecting and transporting layers, and the thickness of the electron injecting and transporting layer are not critical to the practice of the present invention, and so vary with their particular formation techniques. However, a thickness of about 5 to 100 nm is usually preferable.

The thickness of the hole injecting and transporting layers, and the electron injecting and transporting layer is equal to, or ranges from about 1/10 times to about 10 times, the thickness of the light emitting layer although it depends on the design of the recombination/light emitting region. When the electron or hole injecting and transporting layer is separated into an injecting layer and a transporting layer, it is preferable that the injecting layer is at least 1 nm thick and the transporting layer is at least 20 nm thick. The upper limit to thickness is usually about 100 nm for the injecting layer and about 100 nm for the transporting layer. The same film thickness applies when two injecting and transporting layers are provided.

By controlling the layer thickness while taking into account the carrier mobility and carrier density (depending on ionization potential and electron affinity) of the light emitting layer, the electron injecting and transporting layer, and the hole injecting and transporting layer to be combined, the free design of the recombination/light emitting region, the design of emission color, the control of the luminance and spectrum of light emission by the interference of both the electrodes, and the control of the spatial distribution of light emission become feasible.

In the organic EL device according to the invention, the light emitting layer contains a fluorescent material that is a compound capable of emitting light. The fluorescent material used herein, for instance, may be selected from bluish green light emitting materials such as metal complex dyes disclosed in JP-A 63-264692, etc., for instance, tris(8-quinolinolato)aluminum ($Alq^3$), and those disclosed in JP-A's 6-110569 (phenylanthracene derivatives), 6-114456 (tetraarylethene derivatives), 6-100857 and 2-247278. Additionally, quinacridone, coumarin, rubrene, and styryl dyes, tetraphenylbutadiene, anthracene, perylene, coronene, and 12-phthaloperinone derivatives may be used alone or in admixture with the fluorescent material. The light emitting layer may also serve as an electron injecting and transporting layer. In such a case, it is preferable to use tris(8-quinolinolato)aluminum, etc. These fluorescent materials may be evaporated or otherwise deposited for the formation of the light emitting layer.

For the electron injecting and transporting layer which is provided if necessary, there may be used organic metal complexes such as tris(8-quinolinolato)aluminum, oxadiazole derivatives, perylene derivatives, pyridine derivatives, pyrimidine derivatives, quinoline derivatives, quinoxaline derivative, diphenylquinone derivatives, and nitro-substituted fluorene derivatives.

The electron injecting and transporting layer may also serve as a light emitting layer as previously mentioned. In such a case, it is preferable to use tris(8-quinolinolato) aluminum, etc. Like the light emitting layer, the electron injecting and transporting layer may be formed by evaporation or the like.

Where the electron injecting and transporting layer is a double-layered structure comprising an electron injecting layer and an electron transporting layer, two or more compounds are selected in a proper combination from the compounds commonly used for electron injecting and transporting layers. In this regard, it is preferred to laminate layers in such an order that a compound layer having a greater electron affinity is disposed contiguous to the cathode. This order of lamination also applies where a plurality of electron injecting and transporting layers are provided.

For the hole injecting and transporting layers, use may be made of various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (tetraaryldiamine or tetraphenyldiamine (TPD)), aromatic tertiary amines, hydrazone derivatives, carbozole derivatives, triazole derivatives, imidazole derivatives, oxadiazole derivatives having an amino group, and polythiophenes. Where these compounds are used in combination of two or more, they may be stacked as separate layers, or otherwise mixed.

For the hole injecting and transporting layers, two or more compounds are selected in a proper combination from the compounds mentioned above. In this regard, it is preferred to laminate layers in such an order that a compound layer having a lower ionization potential is disposed contiguous to the anode (ITO, etc.). It is also preferred to use a compound having good thin film forming ability at the anode surface. This order of lamination holds for the provision of two or more hole injecting and transporting layers, and is effective as well for lowering drive voltage and preventing the occurrence of current leakage and the appearance and growth of dark spots. Since evaporation is utilized in the manufacture of devices, films as thin as about 1 to 10 nm can be formed in a uniform and pinhole-free state, which restrains any change in color tone of light emission and a drop of efficiency by re-absorption even if a compound having a low ionization potential and absorption in the visible range is used in the hole injecting layer.

Like the light emitting layer and so on, the hole injecting and transporting layers may be formed by evaporating the aforesaid compounds.

For the transparent electrode used as the anode in the practice of the invention, the type and thickness of an anode-forming material are preferably determined such that at least 80% of emitted light transmits therethrough. For example, tin-doped indium oxide (ITO), zinc-doped indium oxide (IZO), ZnO, $SnO_2$, and $In_2O_3$ may be used as the anode. The anode has preferably a thickness of about 10 to 500 nm. The drive voltage should preferably be low enough to improve the reliability of the device. In this connetion, it is preferable to use ITO having 10 to 30 $\Omega/\square$ (with a film thickness of 50 to 300 nm). In actual applications, the film thickness and optical constant of the electrode should be determined such that the interference effect due to reflection at the ITO or other anode interface can satisfy the efficiency of light extraction as well as color puritiy.

The hole injecting and transporting layer, light emitting layer, and electron injecting and transporting layer should preferably be formed by means of a vacuum evaporation process which enables a uniform thin film to be formed. By use of the vacuum evaporation process it is possible to obtain a uniform thin film in an amorphous state or with a grain diameter of 0.1 $\mu$m or lower. A grain diameter exceeding 0.1 $\mu$m results in a non-uniform light emission. To avoid this, it is necessary to increase the driving voltage of the device, but this causes a remarkable drop of electron injecting efficiency.

Preferably but not exclusively, the vacuum evaporation process should be carried out at a degree of vacuum of $10^{-4}$ Pa or lower and a deposition rate of the order of 0.01 to 1 nm/sec. It is also preferable to form the respective layers continuously in vacuo. If the layers are formed continuously in vacuo, it is then possible to achieve high performance because any adsorption of impurities at each layer interface is avoidable. It is also possible to lower the driving voltage of the device and reduce the growth and occurrence of dark spots.

When each layer containing a plurality of compounds is formed by the vacuum evaporation process, it is preferable to place each boat charged with one compound under temperature control for co-evaporation.

While the organic EL structure of the invention is generally used as an EL device of the DC drive type, it is understood that it may be of the AC or pulse drive type. The applied voltage is generally about 5 to 20 volts.

EXAMPLE

The present invention will now be explained more specifically with reference to some examples.

Example 1

A pattern was formed on a 7059 glass substrate made by Corning Co., Ltd., using as blue, green, and red transmitting layers color filters made by Fuji Hanto Co., Ltd., one cutting off light having wavelengths of at least 560 nm and light having wavelengthsof up to 480 nm for green, one cutting off light having wavelengths of at least 490 nm for blue, and one cutting off light having wavelengths of up to 580 nm for red, and utilizing as a fluorescence converting layer a mixture of Rumogen made by BASF and CT-1 made by Fuji Hanto Co., Ltd. in which the light emission maximum wavelength $\lambda$max of a fluorescence spectrum was 610 nm and the half-width was 70 nm.

An acrylic resin was coated on the pattern to a thickness of 5 $\mu$m, and thermoset by heating to 150° C. to form an organic layer.

Then, a barrier layer was formed to a thickness of 30 nm at a film deposition rate of 10 nm/min. by means of an RF sputtering process using $SiO_2$ for a target. At this time, the sputtering gas was Ar at 100 sccm and the film deposition pressure was 0.5 Pa. Sputtering was carried out with a power input of 500 W at a frequency of 13.56 MHz and at a substrate-target distance of 5 cm. The thus obtained film form of barrier layer was composed of $SiO_{2.01}$. The barrier layer had a refractive index of 1.45 at a wavelength of 632 nm, and a film density of 88%.

Then, the obtained film form of barrier layer was subjected on its surface to a plasma cleaning treatment under the following conditions:

Power Input: 2 kW (RF: 13.56 MHz)
Pressure: 125 Pa
$O_2$: 500 SCCM
He: 500 SCCM
Substrate Temperature: 30° C.
Treating Time: 0.5 to 10 minutes Then, an ITO transparent anode (hole injecting electrode) was provided on the substrate to a thickness of 85 nm, and patterned in such a manner that pixels of 64 dots x 7 lines (100×100 $\mu$m for each pixel) were formed. The patterned substrate with the hole injecting electrode formed thereon was ultrasonically washed with neutral detergent, acetone, and ethanol, and then pulled up from boiling ethanol, followed by drying. Following this, the substrate was cleaned on its surface with $UV/O_3$.

Subsequently, the substrate was moved into a film deposition chamber wherein it was fixed to a substrate older in a vacuum evaporation apparatus, which was evacuated to a vacuum of $1 \times 10^{-4}$ Pa or lower. Following this, 4,4',4"-trsi(-N-(3-methylphenyl)-N-phenylamino)triphenylamine (m-MTDATA) was evaporated on the substrate at a deposition rate of 0.2 nm/sec. to a thickness of 40 nm to form a hole injecting layer.

With the vacuum still kept, N,N'-diphenyl-N,N'-m-tolyl-4,4'-diamino-1,1'-biphenyl (TPD) was then evaporated at a deposition rate of 0.2 nm/sec. to a thickness of 35 nm to form a hole transporting layer.

With the vacuum still kept, tris(8-quinolinolato)aluminum ($Alq^3$) was evaporated at a deposition rate of 0.2 nm/sec. to a thickness of 50 nm to form an electron injecting and transporting layer. The total thickness of these layers was 130 nm.

Then, this EL device substrate was transferred from the vacuum evaporation apparatus to a sputtering apparatus wherein an Ag.Mg target was used to form a cathode at a film deposition rate of 10 nm/min. to a thickness of 150 nm by means of a DC sputtering process. The sputtering gas, gas pressure, and power applied were Ar, 1 Pa, and 100 W, respectively, with a spacing of 8 cm between the substrate and the target.

With the vacuum maintained, an Al protective layer was formed to a thickness of 200 nm at a sputtering pressure of 0.3 Pa by means of a DC sputtering process using an Al target. At this time, the sputtering gas, power input and target diameter were Ar, 500 W and 4 inches, with a spacing of 90 mm between the substrate and the target.

The thus prepared organic EL color display was continuously driven at a constant current density of 10 mA/cm² with the application of direct voltage thereon. It was then confirmed that the organic EL structure emitted green light of 8.5 V and 450 cd/m² (with a light emission maximum wavelength λmax of 460 nm). The blue light emitting portion gave off blue light at a luminance of 171 cd/m² with chromaticity coordinates of x=0.129 and y=0.105, the green light emitting portion gave off green light at a luminance of 310 cd/m² with chromaticity coordinates of x=0.340 and y=0.625, and the red light emitting portion gave off red light at a luminance of 75 cd/m² with chromaticity coordinates of x=0.649 and y=0.338.

Next, this organic EL color display was stored in the air at a temperature of 85° C. for 100 hours. Following this, the color display was driven at a constant current density of 10 mA/cm² to measure the enlargement of a non-light emitting area. The results are shown in Table 1. The pixels were 100×100 μm. The enlargement of a non-light emitting portion is indicated by a spacing between one side of the reduced light emitting portion and one side of the original pixel.

TABLE 1

| Sample No. | SiO$_x$ x | Refractive Index n | Non-Light Emitting Portion (spacing between light emitting portion and pixel) (μm) |
|---|---|---|---|
| Invention 1 | 2.01 | 1.45 | <5 |
| Invention 2 | 1.95 | 1.47 | <5 |
| Comp. Ex. 1 | — | — | No light emission found |
| Comp. Ex. 2 | 2.23 | 1.38 | 30 |

Example 2

An organic EL color display was prepared and estimated as in Example 1 with the exception that the barrier layer was composed of SiO$_{1.95}$ and had a refractive index of 1.47 at 632 nm wavelength. The results are given in Table 1.

Example 3

As in Example 1, a sample was prepared with the exception that the size of the pixel to be formed was 300×300 μm and the barrier layer was formed at a substrate temperature of 150° C. with a film density of 87%. A comparative sample was prepared as in Example 1 with the exception that the barrier layer was formed at a substrate temperature of 30° C. (room temperature) with a film density of 75%.

As in Example 1, the obtained organic EL device was measured as to the magnitude of the light emitting area before and after storage, thereby finding the rate of shrinkage. To this end, the device was stored at 85° C. for 100 hours.

Consequently, the inventive sample was found to have a rate of shrinkage of 3% whereas the comparative sample was found to have a rate of shrinkage of 60%.

Example 4

A barrier layer was obtained as in Example 1 with the exception that the conditions for forming the barrier layer were changed to Ar+N$_2$ instead of O$_2$+He, Ar: 200 SCCM, and N$_2$: 5 to 20 SCCM. The obtained barrier layer had a film density of 92%.

A color display was prepared as in Example 1, and measured as to the rate of shrinkage. The rate of shrinkage was as good as 3% or lower.

Example 5

A barrier layer was obtained as in Example 1 with the exception that the conditions for forming the barrier layer were changed to Ar+CH$_4$ instead of O$_2$+He, Ar: 200 SCCM, and CH$_4$: 5 to 20 SCCM. The obtained barrier layer had a film density of 92%.

A color display was prepared as in Example 1, and measured as to the rate of shrinkage. The rate of shrinkage was as good as 3% or lower.

Comparative Example 1

An organic EL color display was obtained and estimated as in Example 1 with the exception that no barrier layer was formed. The results are indicated in Table 1.

Comparative Example 2

An organic EL color display obtained and estimated as in Example 1 with the exception that the barrier layer was composed of SiO$_{2.23}$ and had a refractive index of 1.38 at 632 nm wavelength. The results are indicated in Table 1.

As can be seen from Table 1, the organic EL color displays according to the invention are lower in the non-light emitting area than the comparative color display, and so superior in storability and reliability thereto.

Comparative Example 3

A sample was prepared as in Example 1 with the exception that no plasma treatment was applied before the formation of the barrier layer.

As in Example 1, the obtained sample was measured as to the magnitude of the light emitting area before and after storage, thereby finding the rate of shrinkage.

Consequently, the obtained sample was defoliated or cracked due to a lowering of the adhesion between the barrier layer and the electrode. After a 100-hour storage at 85° C., the sample shrank substantially.

ADVANTAGES OF THE INVENTION

According to the invention, it is thus possible to provide an organic EL color display which can be fabricated easily and at low costs yet with high reliability.

What is claimed is:

1. An organic EL color display, comprising:
   a substrate; and
   in order starting from said substrate, a fluorescence converting layer containing a fluorescent material or a color filter layer or a combination thereof, an organic layer, a barrier layer and an organic EL structure;
wherein said organic layer is formed of a thermosetting resin or an ultraviolet curing resin; and
said barrier layer contains silicon oxide;
wherein said barrier layer has been subjected to a plasma treatment.

2. The organic EL color display according to claim 1, wherein said barrier layer has an average surface roughness of 2 to 50 nm.

3. The organic EL color display according to claim 1, wherein said plasma treatment is carried out at a power input of 500 W for 30 seconds to 5 minutes while a mixture of argon and oxygen is introduced into a plasma ashing system or a sputtering system.

4. The organic EL color display according to claim 1, wherein said barrier layer has a refractive index of 1.40 to 1.55 at a wavelength of 632 nm.

5. The organic EL color display according to claim 4, wherein said refractive index is 1.44 to 1.48 at 632 nm.

6. The organic EL color display according to claim 1, wherein said barrier layer has a thickness of 5 to 100 nm.

7. The organic EL color display according to claim 1, wherein said silicon oxide in said barrier layer is represented by $SiO_x$ where x=1.8 to 2.2.

8. The organic EL color display according to claim 1, wherein said barrier layer has an emitted light transmittance of at least 80%.

9. The organic EL color display according to claim 1, wherein said barrier layer has been formed by a sputtering process.

10. The organic EL color display according to claim 1, wherein said organic layer is formed of an acrylic resin.

11. The organic EL color display according to claim 1, wherein said fluorescence converting layer or said color filter or the combination thereof is planarized by covering them with the organic layer.

12. The organic EL color display according to claim 1, wherein said organic EL structure comprises an anode, a hole injecting layer, a hole transporting layer, a light emitting layer and electron injecting layer, an electron transporting layer and a cathode.

13. An organic EL color display, comprising:
a substrate; and
in order starting from said substrate, a fluorescence converting layer containing a fluorescent material or a color filter layer or a combination thereof, an organic layer, a barrier layer and an organic EL structure;
wherein said organic layer is formed of a thermosetting resin or an ultraviolet curing resin; and
said barrier layer contains silicon oxide;
wherein said silicon oxide in said barrier layer is represented by $SiO_x$ where x=1.5 to 1.9, and contains at least one of carbon and nitrogen in an amount up to 20 at % based on a total amount of carbon and nitrogen in said barrier layer.

14. The organic EL color display according to claim 13, wherein said barrier layer has an average surface roughness of 2 to 50 nm.

15. The organic EL color display according to claim 13, wherein said barrier layer has been subjected to a plasma treatment.

16. The organic EL color display according to claim 15, wherein said plasma treatment is carried out at a power input of 500 W for 30 seconds to 5 minutes while a mixture of argon and oxygen is introduced into a plasma ashing system or a sputtering system.

17. The organic EL color display according to claim 13, wherein said barrier layer has a refractive index of 1.40 to 1.55 at a wavelength of 632 nm.

18. The organic EL color display according to claim 17, wherein said refractive index is 1.44 to 1.48 at 632 nm.

19. The organic EL color display according to claim 13, wherein said barrier layer has a thickness of 5 to 100 nm.

20. The organic EL color display according to claim 13, wherein said silicon oxide in said barrier layer is represented by $SiO_x$ where x=1.8 to 2.2.

21. The organic EL color display according to claim 13, wherein said barrier layer has an emitted light transmittance of at least 80%.

22. The organic EL color display according to claim 13, wherein said barrier layer has been formed by a sputtering process.

23. The organic EL color display according to claim 13, wherein said organic layer is formed of an acrylic resin.

24. The organic EL color display according to claim 13, wherein said an emitted light transmittance of said organic layer is at least 90%.

25. The organic EL color display according to claim 13, wherein said fluorescence converting layer or said color filter or the combination thereof is planarized by covering them with the organic layer.

26. The organic EL color display according to claim 13, wherein said organic EL structure comprises an anode, a hole injecting layer, a hole transporting layer, a light emitting layer, an electron injecting and transporting layer and a cathode.

27. An organic EL color display, comprising:
a substrate; and
in order starting from said substrate, a fluorescence converting layer containing a fluorescent material or a color filter layer or a combination thereof, an organic layer, a barrier layer and an organic EL structure;
wherein said organic layer is formed of a thermosetting resin or an ultraviolet curing resin; and
said barrier layer contains silicon oxide;
wherein said an emitted light transmittance of said organic layer is at least 90%.

28. The organic EL color display according to claim 27, wherein said barrier layer has an average surface roughness of 2 to 50 nm.

29. The organic EL color display according to claim 27, wherein said barrier layer has been subjected to a plasma treatment.

30. The organic EL color display according to claim 29, wherein said plasma treatment is carried out at a power input of 500 W for 30 seconds to 5 minutes while a mixture of argon and oxygen is introduced into a plasma ashing system or a sputtering system.

31. The organic EL color display according to claim 27, wherein said barrier layer has a refractive index of 1.40 to 1.55 at a wavelength of 632 nm.

32. The organic EL color display according to claim 31, wherein said refractive index is 1.44 to 1.48 at 632 nm.

33. The organic EL color display according to claim 27, wherein said barrier layer has a thickness of 5 to 100 nm.

34. The organic EL color display according to claim 27, wherein said silicon oxide in said barrier layer is represented by $SiO_x$ where x=1.8 to 2.2.

35. The organic EL color display according to claim 27, wherein said silicon oxide in said barrier layer is represented by $SiO_x$ where x=1.5 to 1.9, and contains at least one of carbon and nitrogen in an amount up to 20 at % based on a total amount of carbon and nitrogen in said barrier layer.

36. The organic EL color display according to claim 27, wherein said barrier layer has an emitted light transmittance of at least 80%.

37. The organic EL color display according to claim 27, wherein said barrier layer has been formed by a sputtering process.

38. The organic EL color display according to claim 27, wherein said organic layer is formed of an acrylic resin.

39. The organic EL color display according to claim 27, wherein said fluorescence converting layer or said color filter or the combination thereof is planarized by covering them with the organic layer.

40. The organic EL color display according to claim 27, wherein said organic EL structure comprises an anode, a hole injecting layer, a hole transporting layer, a light emitting layer, an electron injecting and transporting layer and a cathode.

* * * * *